US008349547B1

(12) United States Patent
Burckel et al.

(10) Patent No.: US 8,349,547 B1
(45) Date of Patent: Jan. 8, 2013

(54) LITHOGRAPHICALLY DEFINED MICROPOROUS CARBON STRUCTURES

(75) Inventors: David Bruce Burckel, Albuquerque, NM (US); Cody M. Washburn, Albuquerque, NM (US); Ronen Polsky, Albuquerque, NM (US); Susan M. Brozik, Albuquerque, NM (US); David R. Wheeler, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 203 days.

(21) Appl. No.: 12/874,971

(22) Filed: Sep. 2, 2010

Related U.S. Application Data

(60) Provisional application No. 61/292,037, filed on Jan. 4, 2010, provisional application No. 61/288,907, filed on Dec. 22, 2009.

(51) Int. Cl.
G03F 7/26 (2006.01)
(52) U.S. Cl. ......................... 430/322; 430/330
(58) Field of Classification Search .................. 430/322, 430/330
See application file for complete search history.

(56) References Cited

U.S. PATENT DOCUMENTS

| | | | | |
|---|---|---|---|---|
| 5,959,725 | A * | 9/1999 | Ghosh | 356/121 |
| 2002/0094483 | A1 * | 7/2002 | Hattori et al. | 430/5 |
| 2002/0172896 | A1 * | 11/2002 | Adams et al. | 430/322 |
| 2003/0003302 | A1 * | 1/2003 | Fahey et al. | 428/411.1 |
| 2004/0067450 | A1 * | 4/2004 | Leatherdale et al. | 430/322 |
| 2007/0281249 | A1 * | 12/2007 | Tutt et al. | 430/315 |
| 2010/0048388 | A1 * | 2/2010 | Konishi | 502/101 |

OTHER PUBLICATIONS

Adams, Facile Synthesis of Pd-Cd Nanostructures with high Capacity for Hydrogen Storage, JACS Communications, vol. 121, No. 20, 2009, 6930-6931.
Brueck, Optical and Interferometric Lithography—Nanotechnology Enablers, Proceedings of IEEE, vol. 93, No. 10, Oct. 2005, 1704-1721.
Burckel, Lithographically defined carbon growth templates for ELOG of GaN, Journal of Crystal Growth, 310 (2008) 3113-3116.
Burckel, Lithographically Defined Pourous Carbon Electrodes**, Small 2009, 5, No. 24, 2792-2796.
Chu, Ordered Integrated Arrays of Pd and Pt Nanotubules on Al with Controllable Dimensions and Tailored Morphologies, J. of Electrochemical Society, 155, (5)D414-D418 (2008).
El-Deab, Electrochemical Reduction of Oxygen on Gold Nanoparticle-Electrodeposited Glassy Carbon Electrodes, J. of the Electrochemical Society, 150, (7), A851-A857 (2003).
Hakamada, Fabrication of nanoporous palladium by dealloying and its thermal couarssening, J. of Alloys and Compounds, 479 (2009) 326-329.
Hernandez-Santos, Electrocatalytic Determination of Colloidal Gold Particles Using a Carbon Paste Electrode Pretreated in Cyanide Media, Electroanalysis 2000, 12, No. 18, 1461-1466.
Hwang, Nucleation and growth mechanism of electroformation of polypyrrole on a heat-treated gold/highly oriented pyrolytic graphite. Electrochimica Acta 46 (2001) 2843-2853.

(Continued)

*Primary Examiner* — Kathleen Duda
*Assistant Examiner* — Caleen Sullivan
(74) *Attorney, Agent, or Firm* — Kevin W. Bieg

(57) ABSTRACT

A lithographic method is used to fabricate porous carbon structures that can provide electrochemical electrodes having high surface area with uniform and controllable dimensions, providing enormous flexibility to tailor the electrodes toward specific applications. Metal nanoparticles deposited on the surface of the porous carbon electrodes exhibit ultra small dimensions with uniform size distribution. The resulting electrodes are rugged, electrically conductive and show excellent electrochemical behavior.

20 Claims, 14 Drawing Sheets

OTHER PUBLICATIONS

Kiani, Fabrication of palladium coated nanopourous gold film electrode via underpotential deposition and spontaneous metal replacement: A low palladium loading electrode with electrocatalytic activity, Electrochimica Acta 54 (2009) 7254-7259.

Kostecki, Surface studies of carbon films from pyrolyzed photoresist, Thins Solid Films 396 (2001) 36-43.

Krishnamoorthy, Fabrication of 3D Gold Nanoelectrode Ensembles by Chemical Etching, Anal. Chem., 2005, 77, 5088-5071.

Lee, Recent Progress in the Synthesis of Porous Carbon Materials**, Adv. Mater. 2006, 18,2073-2094.

Lee, Effects of gold nanoparticle and electrode surface properties on electrocatalytic silver deposition for electrochemical DNA hybridization detection, The Analyst, 2005, 130, 364-369.

Liang, Mesoporous Carbon materials: Synthesis and Modification, Angew. Chem. Int. 2008, 47, 3696-3717.

Liu, Fabrication of 3D photonic crystals with two-beam holographic technique. Proceedings of SPIE vol. 5450, 474-480, (2004).

McCreery, Advanced Carbon Electrode Materials for Molecular Electrochemistry, Chemical Reviews, 2008, vol. 108, No. 7, 2646-2686.

Menon, Fabrication and Evaluation of Nanoelectrode Ensembles, Anal. Chem. 1995, 67, 1920-1928.

Niesz, Fabrication of two- and three-dimensional model catalyst systems with monodispersed platinum nanoparticles as active metal building blocks, Inorganica Chimica Acta 359 (2006) 2683-2689.

Nowak, Characterization of Carbon/Nitroazobenzene/Titanium Molecular Electronic Junctions with Photoelectron and Raman Spectroscopy, Anal. Chem. 2004, 76, 1089-1097.

Park, Structural and electrochemical features of 3D nanoporous platinum electrodes, Electrochimica Acta, 55, (2010) 2029-2035.

Ranganathan, Electroanalytical Performance of Carbon Films with Near-Atomic Flatness, Anal. Chem. 2001, 73, 893-900.

Ranganathan, Photoresist-Derived Carbon for Microelectromechanical Systems and Electrochemical Applications, J. of the Electrochemical Society, 147, (1) 277-282, (2000).

Shipway, Nanoparticle Arrays on Surfaces for Electronic, Optical, and Sensor Applications, Chemphyschem, 2000, 1, 18-52.

Singh, Pyrolysis of Negative Photoresists to Fabricate Carbon Structures for Microelectromechanical Systems and Electrochemical Applications, J. of Electrochemical Society, 149, (3) E78-E83 (2002).

Stein, Functionalization of Porous Carbon Materials with Designed Pore Architecture, Adv. Mater. 2009, 21, 265-293.

Tian, Synthesis of Tetrahexahedral Platinum Nanocrystals with High-Index Facets and High Electro-Oxidation Activity, Science, May 4, 2007, vol. 316, 732-735.

Walcarius, Template-directed porous electrodes in electroanalysis, Anal. Bioanal Chem. (2010) 396 261-272.

Wang, C-MEMS for the Manufacture of 3D Microbatteries, Electrochemical and Solid-State Letters, 7 (11) A435-A438 (2004).

* cited by examiner

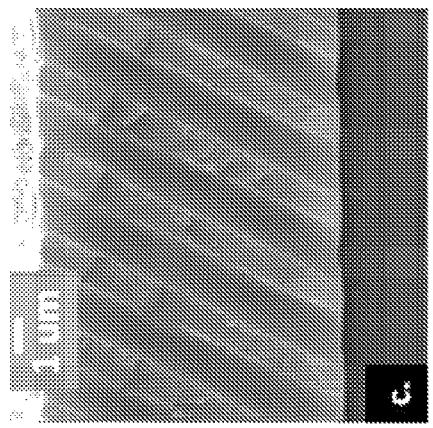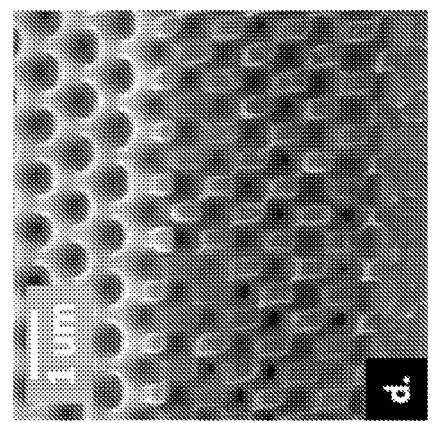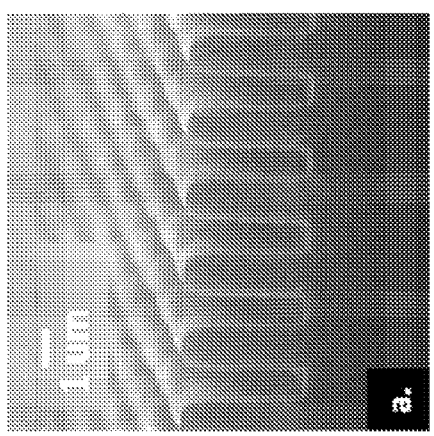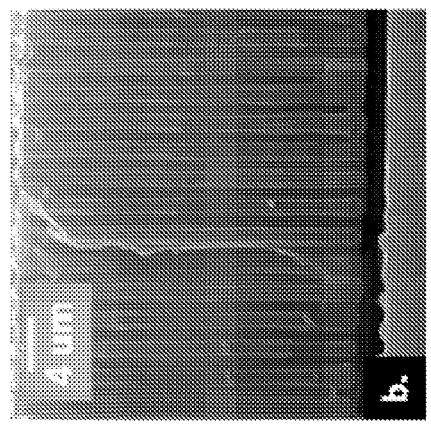
FIGS. 3A-D

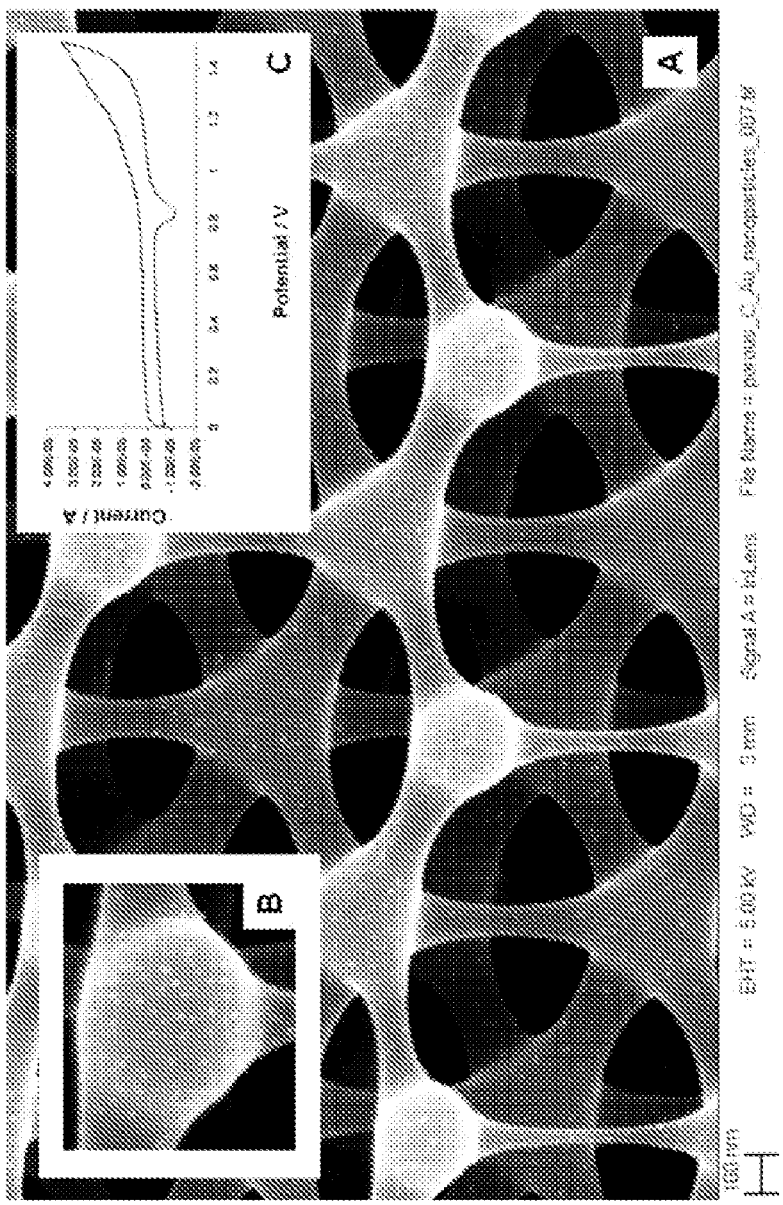
FIGS. 6A-C

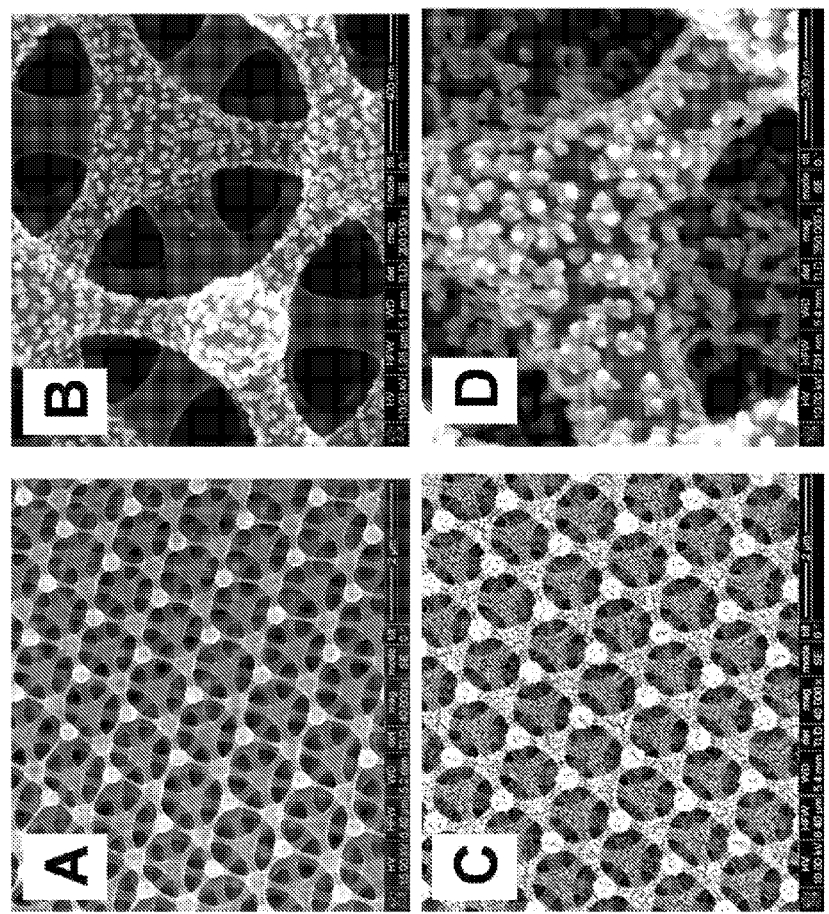
FIGS. 8A-D

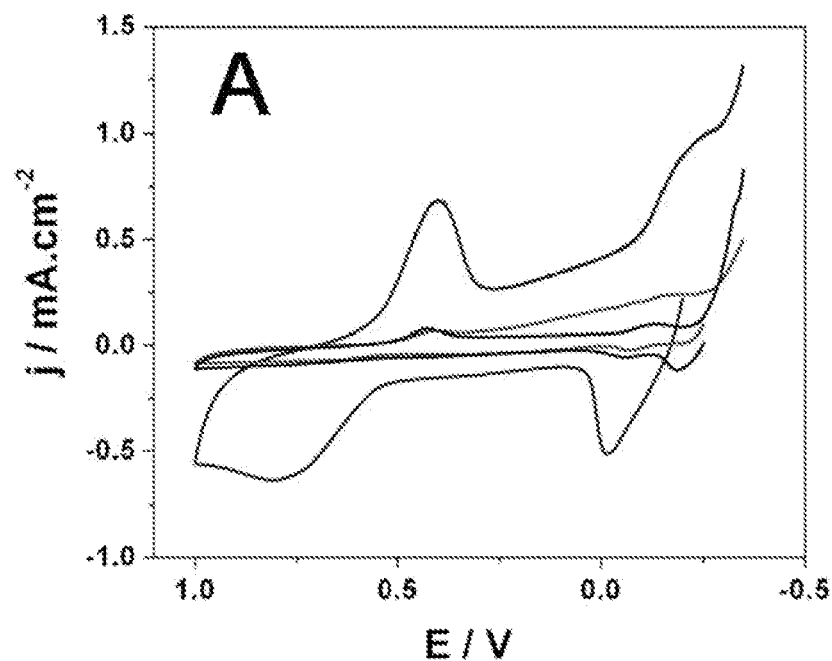
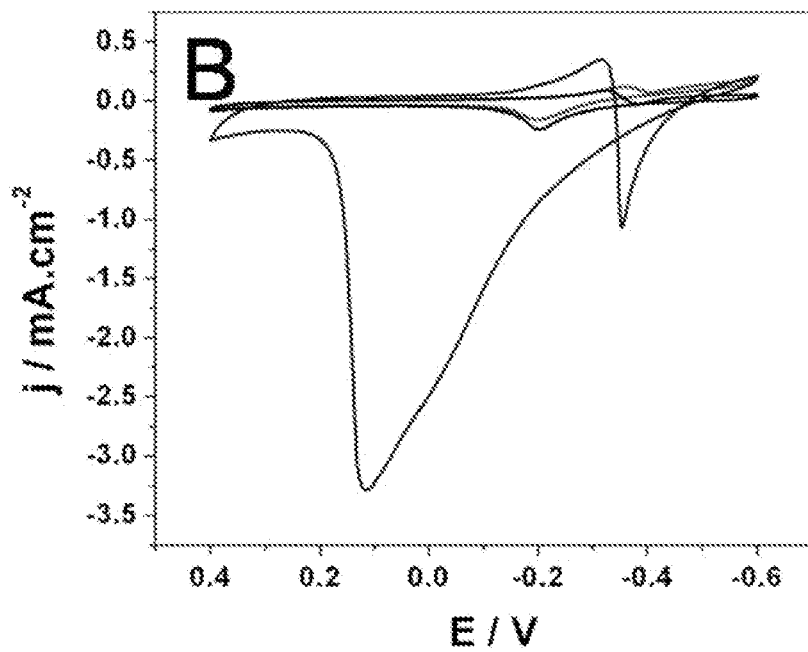
FIGS. 9A-B

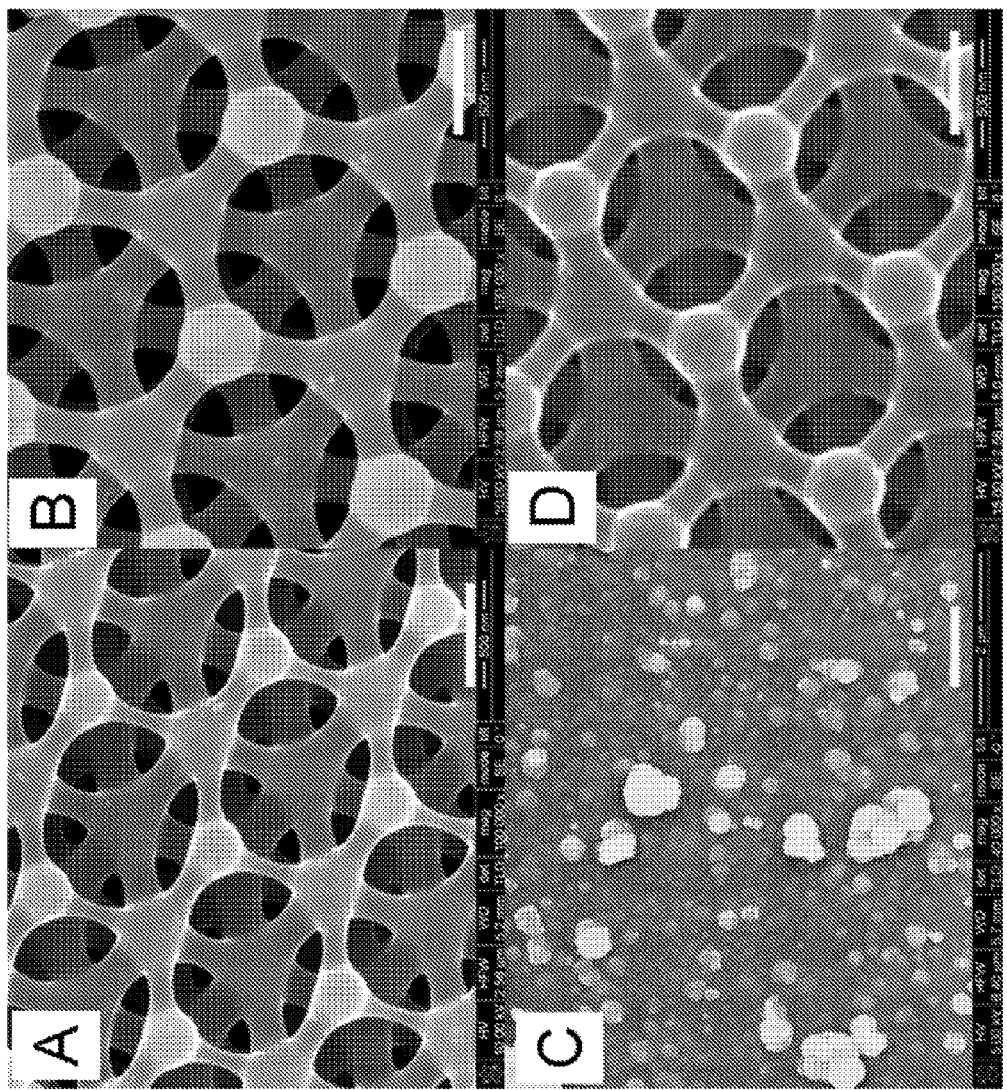
FIGS. 10A-D

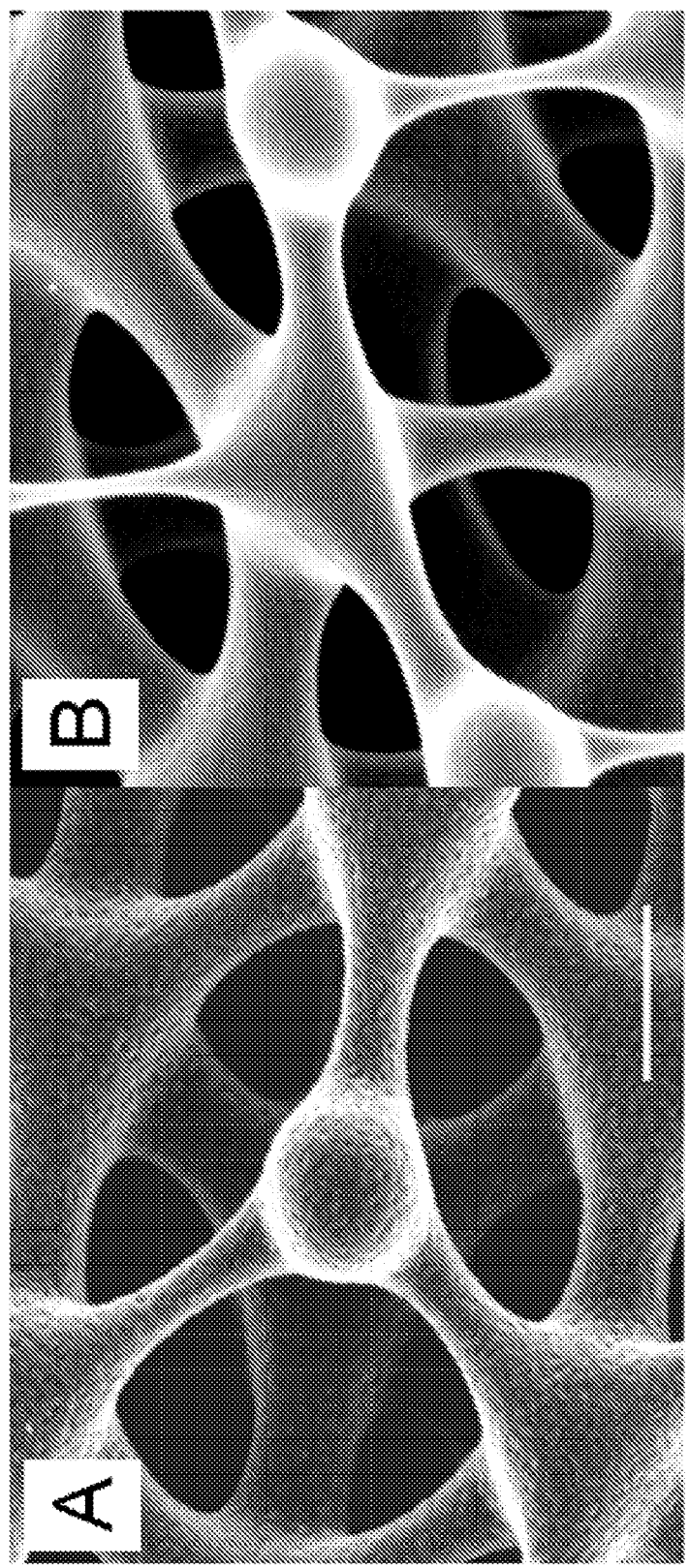
FIGS. 11A-B

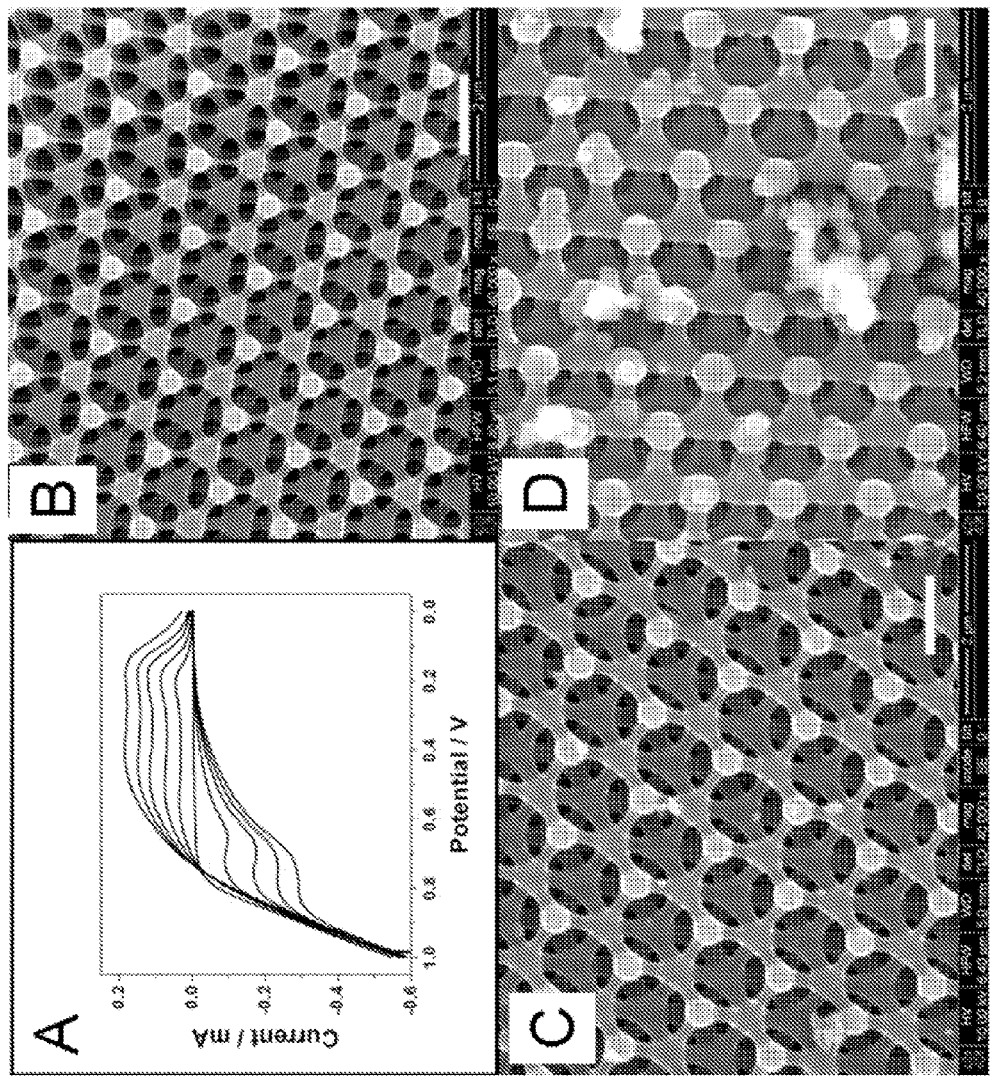
FIGS. 12A-D

LITHOGRAPHICALLY DEFINED MICROPOROUS CARBON STRUCTURES

CROSS-REFERENCE TO RELATED APPLICATION

This application claims the benefit of U.S. Provisional Application No. 61/292,037, filed Jan. 4, 2010, and U.S. Provisional Application No. 61/288,907, filed Dec. 22, 2009, both of which are incorporated herein by reference.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to porous carbon materials and, in particular, to lithographically defined microporous carbon structures.

BACKGROUND OF THE INVENTION

The special nature of the C—C bond can lead to various polymorphic forms of carbon, such as graphite, glassy-carbon, fullerenes (such as buckyballs), carbon nanotubes and diamond. In addition to the intrinsic material properties of carbon, functionalized films can be produced through chemical modification using a wide range of chemistries. Because of this flexibility and utility, fabrication of both macro- and microporous carbon films, with their commensurate increase in surface area, continues to receive significant research interest. See A. Stein et al., *Adv. Mat.* 21 (2), 265 (2009); C. D. Liang et al., *Ang. Chem. Int. Ed.* 47, 3696 (2008); and J. Lee et al., *Adv. Mat.* 18, 2073 (2006). Some of the specific applications for porous carbon materials include fuel cells, electrochemical double layer capacitors, high surface area catalytic supports, water purification and gas separation.

Electrodes made from carbon exhibit many useful properties including wide potential windows, low background capacitance, resistance to fouling, and catalytic activity for many analytes compared to solid metal electrodes. See R. L. McCreery, *Chemical Reviews* 108, 2646 (2008). The nano- and/or microstructuring of electrodes can lead to high surface area catalytically active interfaces and have been achieved through tuning particle size and shape, making the catalytic surface in porous networks, or dispersing catalytic particles into porous templates. See N. Tian et al., *Science* 316, 732 (2007); D. W. Goodman, *Nature* 454, 948 (2008); B. Adams et al., *J. Am. Chem. Soc.* 131, 6930 (2009); A. Kiani and E. N. Fard, *Electrochimica Acta* 54, 7254 (2009); M. Hakamada and M. Mabuchi, *J. Alloys and Compounds* 479, 326 (2009); K. Krishnamoorthy and C. G. Zoski, *Anal. Chem.* 77, 5068 (2005); S. Park et al., *Electrochimica Acta* 55, 2029 (2010); K. Niesz et al., *Inorgan. Chim. Acta* 359, 2683 (2006); and S. Z. Chu et al., *J. Electro. Soc.* 155, D414 (2008). However, due to small pore diameters, pore nonuniformity, and possible hydrophobicity, diffusion or penetration of electrolyte is often limited to a certain depth in many synthetic (nano) mesoporous materials which can limit any advantage of modifying the structures with functional materials such as catalytic particles or large biomolecules. Another reason to fabricate nano- and/or micro-features is to influence the diffusional mass transport of reactants, such as fuels or analytes. Structures which have at least one dimension smaller than the Nernst diffusion layer thickness can experience hemispherical diffusion profiles that result in increased mass transport. See Wang, *J. Analytical Electrochemistry*, $3^{rd}$ Ed. Wiley-VCH, 151 (2006). While smaller structures and pores can be used to increase active surface areas they are often made at a high density resulting in decreased mass transport (linear diffusion) profiles due to overlapping diffusion layers. See V. Menon and C. R. Martin, *Anal. Chem.* 67, 1920 (1995); and M. De Leo et al., *Electroanalysis* 19, 227 (2007). Thus, an inherent trade-off exists between maximizing surface area and preserving favorable hemispherical diffusion characteristics. See A. Walcarius, *Anal. Bioanal. Chem.* 396, 261 (2010).

Therefore, a need remains for microporous carbon structures having high surface area with uniform and controllable dimensions that can provide electrodes having properties tailorable for specific applications:

SUMMARY OF THE INVENTION

The present invention is directed to lithographically defined microporous carbon structures and methods to fabricate such structures. A method comprises depositing a carbon-containing photoresist onto a substrate, lithographically defining a microporous structure in the deposited photoresist, developing the lithographically defined photoresist, and pyrolyzing the developed photoresist to provide a microporous carbon structure. The microporous carbon structure can be functionalized with metal nanoparticles or a conducting polymer.

Interferometric lithography is preferably used to define the structures in the photoresist. The developed photoresist structures can be converted to carbon through pyrolysis in a reducing atmosphere. The structures undergo significant shrinkage during pyrolysis, but maintain their pattern morphology and adhesion to the substrate. The porous carbon material can then be used as an electrode for electrochemical deposition of ultra-small metal (e.g., gold, palladium, silver) nanoparticles. The resulting engineered structures span seven orders of magnitude in size scale.

The lithographic method for fabrication of porous carbon electrodes enables high surface area with uniform and controllable dimensions, providing enormous flexibility to tailor electrodes toward specific applications. The electrodes are rugged, electrically conductive and show excellent electrochemical behavior. Metal nanoparticles electrochemically deposited on the surface of the porous carbon electrodes exhibit ultra small dimensions with uniform size distribution, attributed to the smooth carbon surface and a high degree of hydrogen termination due to the reducing atmosphere used during the pyrolysis process. The method enables porous carbon structures with dimensions that can be customized. The ability to create structures over these wide-ranging size scales offers the potential to harness nano-scale behaviors in measurable, macro-scale devices. Structural parameters, such as pore size and dimensional morphology, provides control of the electrochemical behavior of the electrode. These parameters can be controlled at the lithography step, and hence can be rationally engineered for optimal performance.

The geometry of 3-D carbon substrates, defined by interferometric lithography, can behave as microelectrodes that exhibit hemispherical diffusion profiles that can lead to increased mass transport capabilities. Since such 3-D porous carbon can be patterned at variable geometries (i.e., number of layers, separation distances between layers, arm diameter, layer thickness, etc.), these electrodes can have many advantages over synthetic (nano)mesoporous materials, including optimized pore sizes to promote mass transport into inner pores, 3-D high surface area-to-loading capabilities for catalytic nanoparticles enabling the full usage of the catalytic particles over the entire porous structure, and improved morphological film depositions for conducting polymers. Electrochemical experiments demonstrate the lithographically defined porous carbon material as a highly adaptable electrode material. The 3-D carbon electrodes with interconnected porosity combine the advantages of nanostructuring and increased mass transport. The unique highly ordered nanostructures provide increased pathways for reaction species to diffuse and react throughout entire catalyst-modified electrode surfaces and exhibit microelectrode response characteristics. Such characteristics can be effective for increased catalytic oxidation of methanol and uncharacteristically uniform deposition of conducting polymer. These electrodes can also provide benefits in such applications as batteries, supercapacitors, biological sensors and hydrogen storage devices.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

FIGS. 3A-D are cross-sectional SEM images showing 1-D, tilted 1-D, 2-D, and 3-D structures using the respective exposure geometries shown in FIGS. 2A-D.

FIG. 6A is a low magnification SEM image of electrochemically deposited Au nanoparticles (1-3 nm in diameter) on the surface of the 3-D pyrolyzed carbon structure. FIG. 6B is a high magnification SEM image of deposited Au nanoparticles. FIG. 6C are cyclic voltammetry curves from the Au particle deposition.

FIGS. 8A-D are SEM images of Pd deposition at 3-D porous carbon electrodes. FIGS. 8A and 8B are SEM images of carbon electrodes with Pd deposition from 2 mM Pd/0.5 M $H_2SO_4$. FIGS. 8C and 8D are SEM images of carbon electrodes with Pd deposition from 2 mM Pd/(MeCN+$H_2O$+0.1 M HCl). The deposition potential was −0.45 V and the deposition time was 100 s.

FIGS. 9A and 9B are cyclic voltammograms of Pd/porous, Pd/top, and Pd/GC in 0.5 M $HClO_4$ (FIG. 9A) and 0.5 M NaOH+0.3 M $CH_3OH$ (FIG. 9B). The scan rate was 50 mV/s.

FIGS. 10A and 10B are SEMs porous carbon structures with poly(bithiophene) deposition at 850 mV for 30 and 60 sec, respectively. FIG. 10C is a SEM of a porous carbon structure with bithiophene deposition at 850 mV for 60 sec. FIG. 10D is a SEM of a porous carbon structure with poly(pyrrole) deposited using 2 cyclic voltammograms. The scale bars for FIGS. 10A, 10B, and 10D is 500 nm. The scale bar for FIG. 10C is 1 µM.

FIGS. 11A and 11B are high magnification SEMs after 30 sec of bithiophene deposition at 850 mV and bare porous carbon, respectively. The scale bar is 250 nm.

FIG. 12A is a cyclic voltammograms of poly(bithiophene) deposition. The scan rate was 10 mV/sec. FIGS. 12B-D are SEMs of poly(bithiophene) deposition after 0, 2, and 5 cycles, respectively. The scale bar is 1 µm.

DETAILED DESCRIPTION OF THE INVENTION

The present invention is directed to lithographically defined porous pyrolyzed photoresist films. Pyrolyzed photoresist films have similar properties as glassy carbon electrodes with an advantage that they can be lithographically defined. Therefore, the invention is further directed to a lithographically defined microporous carbon electrode and to the deposition and electrochemical properties of metal nanoparticles or conducting polymers on these electrodes. The fabrication method is capable of producing large area (e.g., 10's $cm^2$), sub-micrometer porous carbon films. Interferometric lithography can be used to pattern thick photoresist films into 3-D periodic lattices. These structures can then converted to carbon via pyrolysis under flowing forming gas. See S. Ranganathan et al., J. Electrochem. Soc. 147, 277 (2000), which is incorporated herein by reference. During pyrolysis, the non-carbon species in the resist polymer backbone are removed, while the bulk of the carbon remains. The patterned structures undergo significant shrinkage, but maintain their morphology and adhesion to the substrate. The degree of carbonization is a function of the pyrolysis temperature, which affects the DC conductivity. The resulting porous carbon structures are conductive and suitable for the electrochemical deposition of ultrasmall (1-3 nm) metal nanoparticles (e.g., gold nanoparticles, AuNPs) with high catalytic surface area. Further, other metals (e.g., palladium or platinum) can be deposited directly or precipitated on the previously deposited AuNPs supported on the surface of the porous carbon electrode. The structure of the pyrolyzed photoresist (e.g., pore size, lattice dimensions, number of layers, etc.) can be engineered to optimize the electrochemical performance of the deposited nanoparticles (e.g., diffusion length, mass transport characteristics, etc.).

Figure 1:
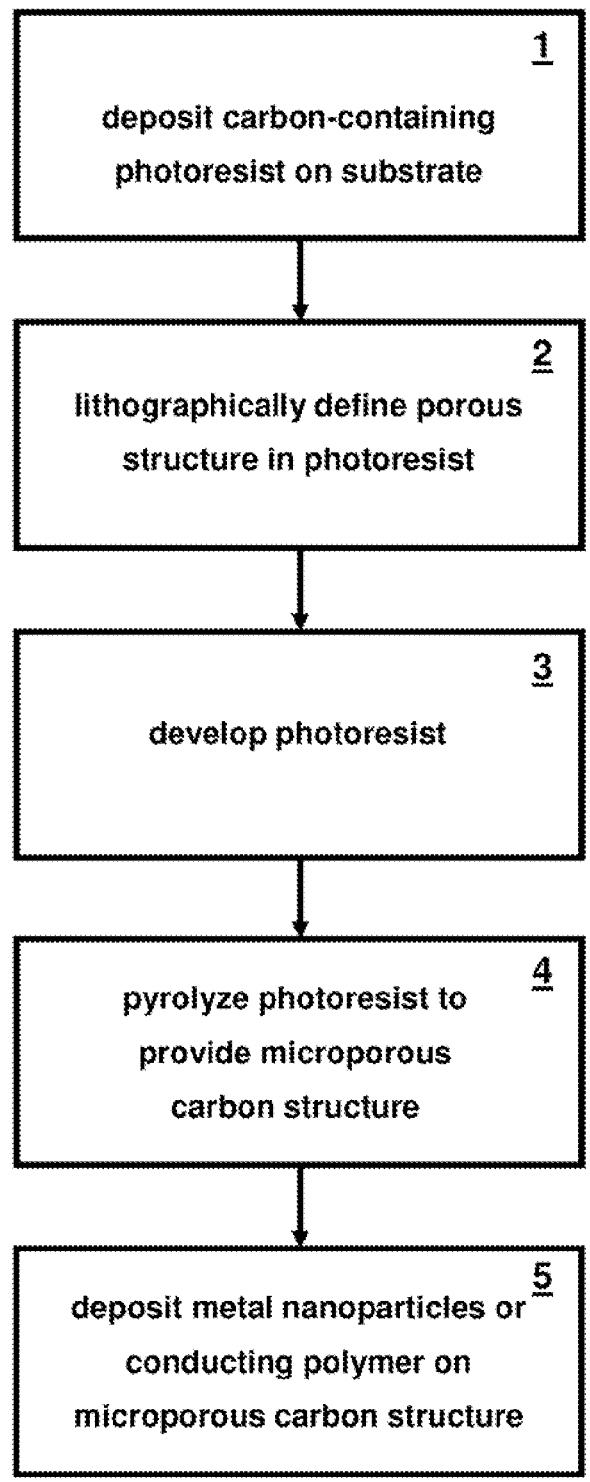
FIG. 1 is a flow diagram of a method to fabricate a lithographically defined microporous carbon structure.

A method to fabricate the lithographically defined microporous carbon structures is shown in FIG. 1. The method comprises depositing a carbon-containing photoresist onto a substrate, lithographically defining a microporous structure in the deposited photoresist, developing the lithographically defined photoresist, and pyrolyzing the developed photoresist to provide a microporous carbon structure. The microporous carbon structure can be functionalized with metal nanoparticles or a conducting polymer. As an example of the present invention, a method will be described hereinafter of lithographically defining a microporous structure in a negative photoresist using two-beam interferometric lithography, developing to remove the uncrosslinked portions of the lithographically defined photoresist, and pyrolyzing the developed photoresist in a reducing atmosphere of hot forming gas to provide a porous carbon structure. The porous carbon structure was decorated with gold nanoparticles, on which catalytic palladium was deposited. Such palladium-modified porous carbon electrodes exhibit a catalytic response for methanol oxidation with potential application towards microfabricated fuel cells.

At step 1, formation of a microporous carbon structure begins with deposition of a carbon-containing photoresist onto a substrate. The substrate can be any material that is compatible with subsequent processing at the pyrolysis temperature (e.g., 900 to 1200° C.). For example, silicon, silica, or sapphire substrates can be used. Preferably, the substrate can be spin-coated with a bottom anti-reflection coating (BARC). For example, a thin i-line anti-reflection coating (i-CON®-7, Brewer Science) can be spun onto a plasma-cleaned silicon wafer and baked on a vacuum hotplate at 205° C. for 60 s. An adhesion thin layer (~100 nm) of negative resist NR7-100P can be deposited and spun onto the anti-reflection coating at 3000 RPM. The adhesion layer can be cross-linked by a flood exposure and post exposure baked at 130° C. on a vacuum hotplate. Next, a thick layer (e.g., about 6 μm) of NR7 can be spun onto the substrate at 3000 RPM and soft baked at 130° C. for 120 s on a vacuum hotplate.

At step 2, a porous structure is lithographically defined in the photoresist. Preferably, interferometric lithography is used to define the porous structure. Interferometric lithography is a maskless lithography approach where coherent plane waves are combined forming an interference pattern whose intensity distribution is recorded in a photosensitive layer (e.g., a photoresist) and is later transferred (developed) by thermal and/or chemical processes. See S. R. J. Brueck, *Proc. IEEE* 93, 1704 (2005); which is incorporated herein by reference. Because it is maskless, interferometric lithography can be used to generate volumetric exposures. The geometry of the exposed resist is controlled by the number and relative angles of the interfering planewaves. 3-D fcc structures can be created in a single exposure with four interfering beams. However, control over polarization is desirable in order to ensure maximum contrast between each of the four beams. Therefore, two-beam interferometric lithography is preferred. The optical setup with two-beam interference is simpler and more flexible compared to multi-beam interference methods, enabling large and uniform 3-D structures to be defined. As shown in FIGS. 2A-D, interferometric lithography can be used to define 1-D, tilted 1-D, 2-D, and 3-D resist structures, using one, two, or three separate two-beam exposures.

Figure 2A:
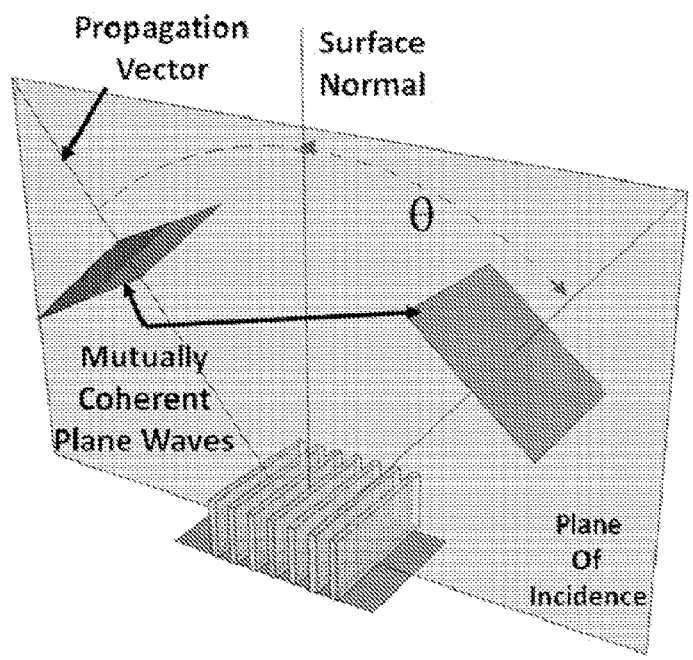
FIGS. 2A-D are schematic illustrations of interferometric lithography exposure geometries to achieve 1-D, tilted 1-D, 2-D, and 3-D structures, respectively.
Figure 2B:
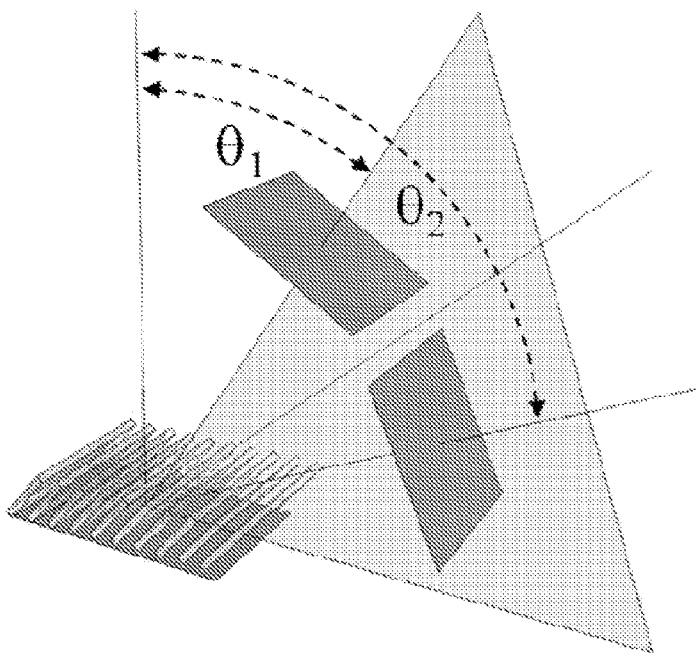
Figure 2C:
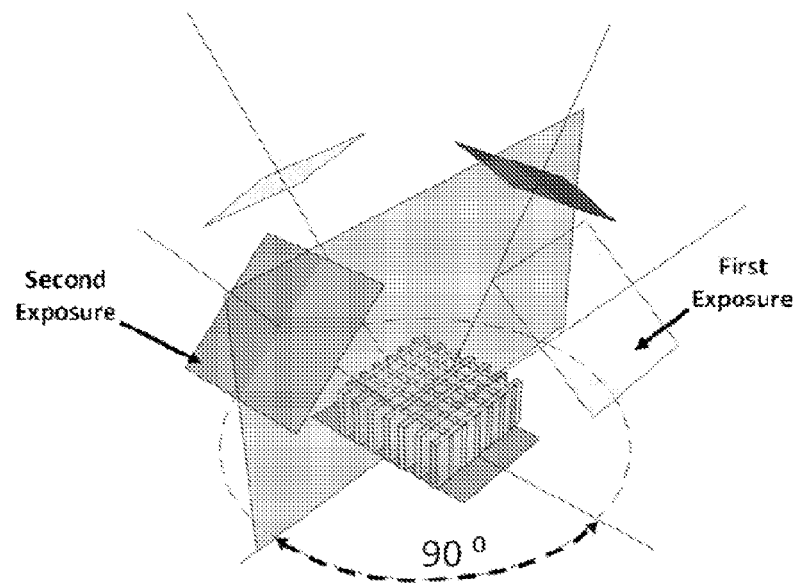
Figure 2D:
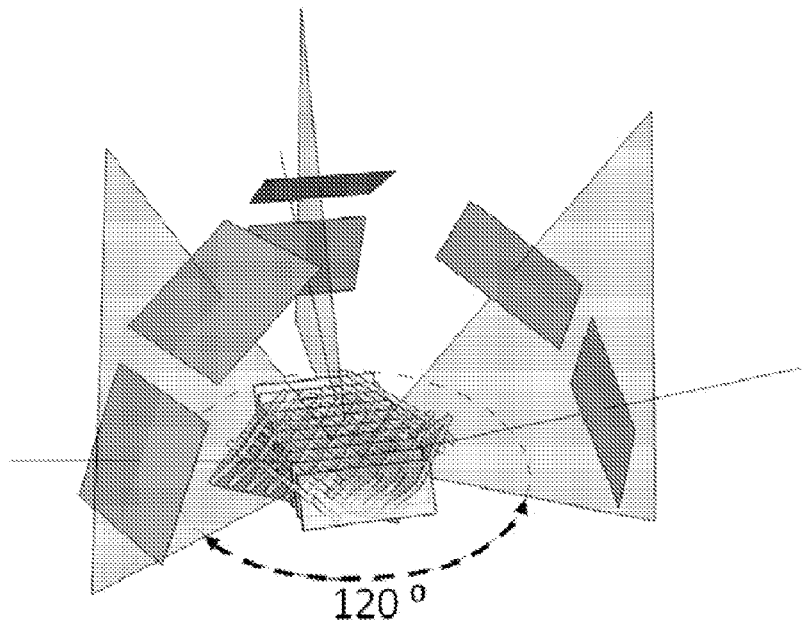

As shown in FIG. 2D, for 3-D structures, three separate two-beam exposures can be used with the two laser beams maintained in a fixed relative position, with an in-plane sample rotation of 120 degrees between exposures. See Y. Liu et al., *Proc. of SPIE* 5450, 473 (2004), which is incorporated herein by reference. The frequency-tripled 355 nm line of a Q-switched Nd:YAG laser can be used to form the inference pattern by i-line lithography. As an example, the laser beam can be expanded and split into two separate beams and interfered with an angle of 32 degrees between the planewave propagation vectors. The plane of incidence contains both propagation vectors as well as the angle bisector of the propagation vectors. The angle-bisector is tilted with respect to the sample surface normal by 45 degrees. After each exposure the sample is rotated in the plane by 120 degrees and the process is repeated a total of three times. The spacing between the high intensity regions of the interference pattern used to expose the resist is controlled by the angle of incidence between the interfering beams. Increasing the angle between the beams results in a smaller spacing in the exposure pattern, and therefore a resist structure with smaller spacing between the features. The pore size, carbon resist cross section, and layer spacing between the final carbon structure scale with the angle of incidence.

At step 3, the lithographically defined photoresist structure is developed. The exposure geometry illustrated in the schematic of FIG. 2D results in a volumetric interference pattern which causes cross-linking in the thick negative resist in regions of high intensity. A post exposure bake (PEB) of 85° C. for 2 minutes on a vacuum hotplate can be used to complete the cross-linking process in the exposed regions. The fabrication of the exposed negative resist structure can be completed with a puddle development, for example, using resist developer RD6 (Futurrex, Inc) and spin drying the developed photoresist.

Figure 4B:
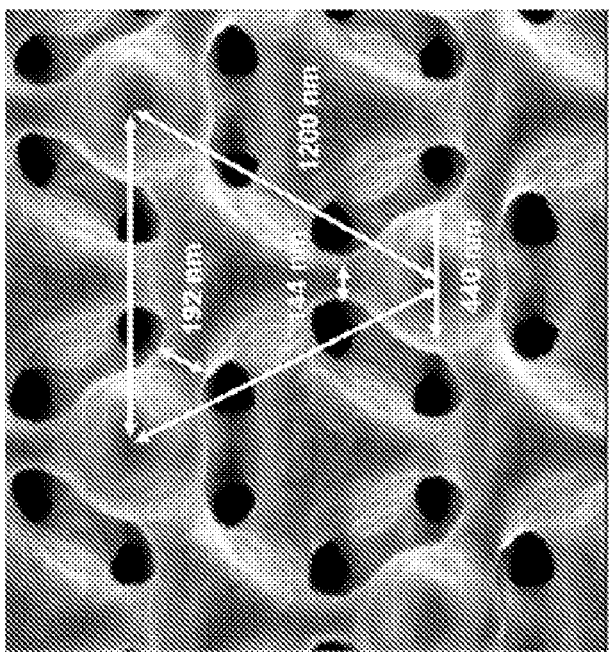
FIG. 4B is a high magnification SEM image of photoresist structure.
Figure 4A:
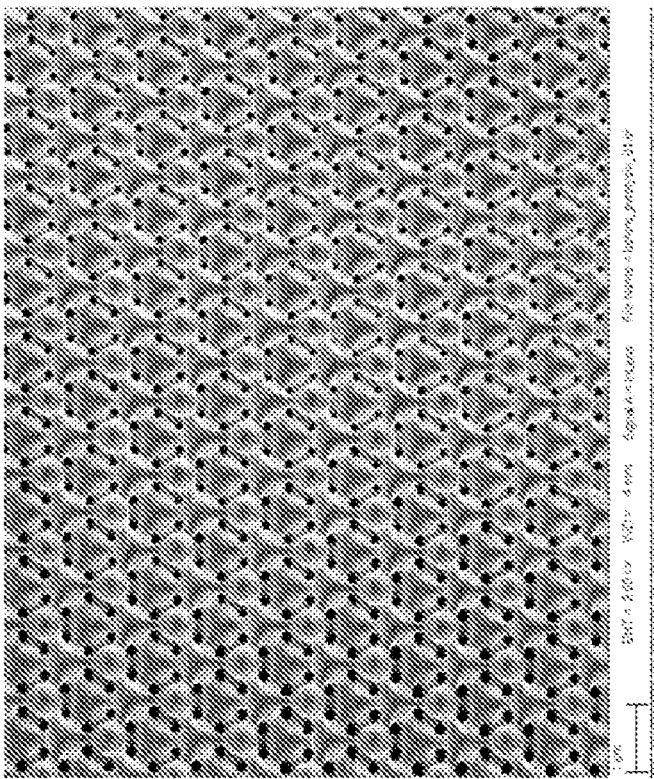
FIG. 4A is a low magnification scanning electron micrograph (SEM) image of lithographically defined 3-D photoresist structure after development.

When careful control over the relative spatial phase between the three exposures is exercised, interferometric lithography can produce defect free 3-D lattices with a sub-wavelength periodicity uniformly over samples in excess of 2 cm on a side. The size of the resulting interference pattern can be increased by increasing the size of the interfering beams with simple beam expanding optics, so that large areas can be patterned with no loss of uniformity. FIGS. 3A-D shows some of the possible resist structures using the exposure geometries of FIGS. 2A-D. FIG. 4A shows a low-magnification scanning electron micrograph (SEM) image of a developed 3-D photoresist pattern. FIG. 4B shows a higher magnification image identifying the relevant geometrical dimensions. The structure consists of nominally spherical nodes connected by spokes in a triangular lattice. A slight variation in the pore diameter is observed, but the resist structure is uniform to this scale of variation over the entire 2.5 cm×2.5 cm sample. The interference pattern exists throughout the volume where the interfering plane waves overlap, making it possible to create high aspect ratio structures in thick resist. Alternatively, fewer layers can be achieved by simply starting with a thinner resist. The development time for this exemplary thick structure was 120 seconds. With such a long development cycle, the top layer of the structure is exposed to the developer longer than the bottom layer. As a result, the diameter of the spokes on the top layer is noticeably smaller than the diameter of the spokes on the subsequent layers.

At step 4, the developed photoresist is pyrolyzed to provide a microporous carbon structure. For example, the fully formed resist structure with the 3-D periodic geometry shown in FIG. 4 can be placed in a tube furnace with flowing forming gas and heated to 1050° C. at a ramp rate of 5° C./min and held isothermal for 1 hour before cooling to room temperature at a similar ramp rate. Heating the non-conducting resist in this reducing atmosphere (5% $H_2$/95% $N_2$) causes pyrolysis of the photoresist, whereby non-carbon species in the polymer are driven off, leaving predominately carbon. See A. Singh et al., *J. Electrochem. Soc.* 149, E78 (2002); and C. L. Wang et al., *Electrochem. Solid-State Lett.* 7, A435 (2004); which are incorporated herein by reference.

Figure 5B:
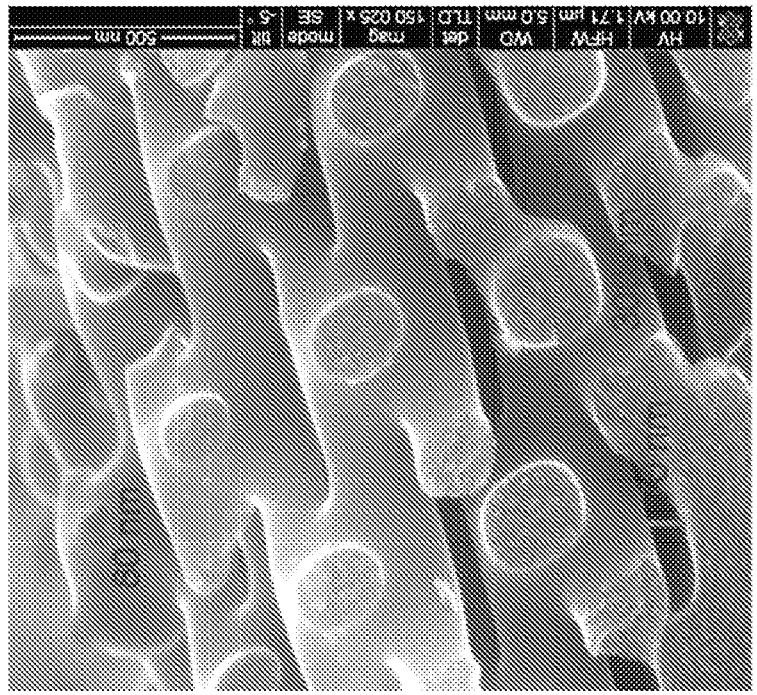
FIG. 5B is a cross-sectional view SEM image of the 3-D pyrolyzed carbon structure.
Figure 5A:
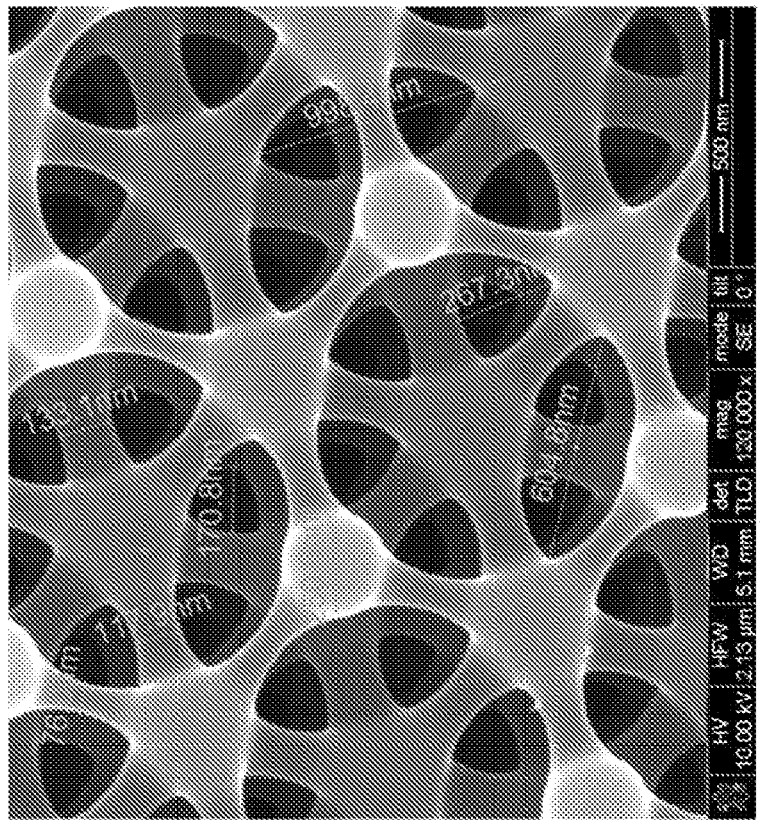
FIG. 5A is a low magnification SEM image of lithographically defined 3-D pyrolyzed carbon structure.

As shown in FIGS. 5A-B, the resulting exemplary conducting carbon electrode consists of five interconnected layers of hexagonal pores. Connecting three point junctions in the pores are about 250 nm in diameter at the top layer (consisting of spherical nodes at the top layer only) and about 500 nm at the second layer; the pore opening is about 600 nm from the top to the second layer and 300 nm from the top to the third; the arm diameter at the bottom and top layers is about 300 nm and about 80 nm, respectively; and the separation distance between individual layers (arms) is minimally more than 60 nm.

Raman spectroscopy of these pyrolyzed films confirmed that the carbon was in an amorphous state with only localized graphitic crystallization, consistent with other accounts in the literature. See R. Kostecki et al., *Thin Solid Films* 396, 36 (2001). The chemical structure of these 3-D carbon electrodes resembles that of glassy carbon, consisting of mostly amorphous carbon with small graphitic $sp^2$ and diamond-like $sp^3$ regions while exhibiting a wide potential window in aqueous media with a very low current background. In addition, pyrolyzed photoresist films are known to have atomically flat surfaces with a high degree of hydrogen termination. See D. B. Burckel et al., *Small* 5, 2792 (2009); R. L. McCreery, *Chem. Rev.* 108, 2646 (2008); and S. Ranganathan and R. L. McCreery, *Anal. Chem.* 73, 893 (2001).

Previous work indicates that the patterns shrink as much as 80% in the vertical direction and about 50% in the horizontal direction during pyrolysis. See D. B. Burckel et al., *J. Crystal Growth* 310, 3113 (2008). The initial resist structure in FIG. 4 had a thickness of about 6000 nm and a vertical periodicity of about 1400 nm, while the pyrolyzed pattern of FIG. 5 has a periodicity of about 450 nm and a thickness of about 1700 nm. As can be seen in FIG. 5, the seemingly dense photoresist structure of FIG. 4 becomes a sparse carbon structure when pyrolyzed, but the triangular symmetry is largely maintained. There is some obvious distortion of the matrix, but the resultant lattice dimension only changes by about 5% while the diameter of the nodes shrinks by 40%. The spokes on the top layer of the structure shrink by 80% while the spokes on the second layer shrink by 60%. Throughout the pyrolysis process, the structures maintain adhesion to the substrate, so that the final carbon structures possess a rigid support. Silicon and glassy carbon both possess similar thermal expansion coefficients ($TCE_{Si}=3.9\times10^{-6\circ}$ C.$^{-1}$, S. K. Ghandhi in VLSI Fabrication Principles Wiley & Sons, New York, 1983, Ch. 1, p. 45; $TCE_{glassy\text{-}C}=3.2\text{-}6.92\times10^{-6\circ}$ C.$^{-1}$, S. T. Lacono et al., *Carbon* 45, 931 (2007)), however pyrolysis has also been performed on both fused silica and $Al_2O_3$ with similar results. The combination of lateral shrinkage and simultaneous adhesion to the substrate results in formation of a "foot" at the interface between the carbon structure and the substrate. See D. B. Burckel et al., *J. Crystal Growth* 310, 3113 (2008). Although the above example uses a chemically amplified phenolic resin negative resist, other positive and negative resists, such as patterned positive tone novolac resin resists and photo-epoxy SU-8, can also be pyrolyzed with similar results.

Figure 6D:
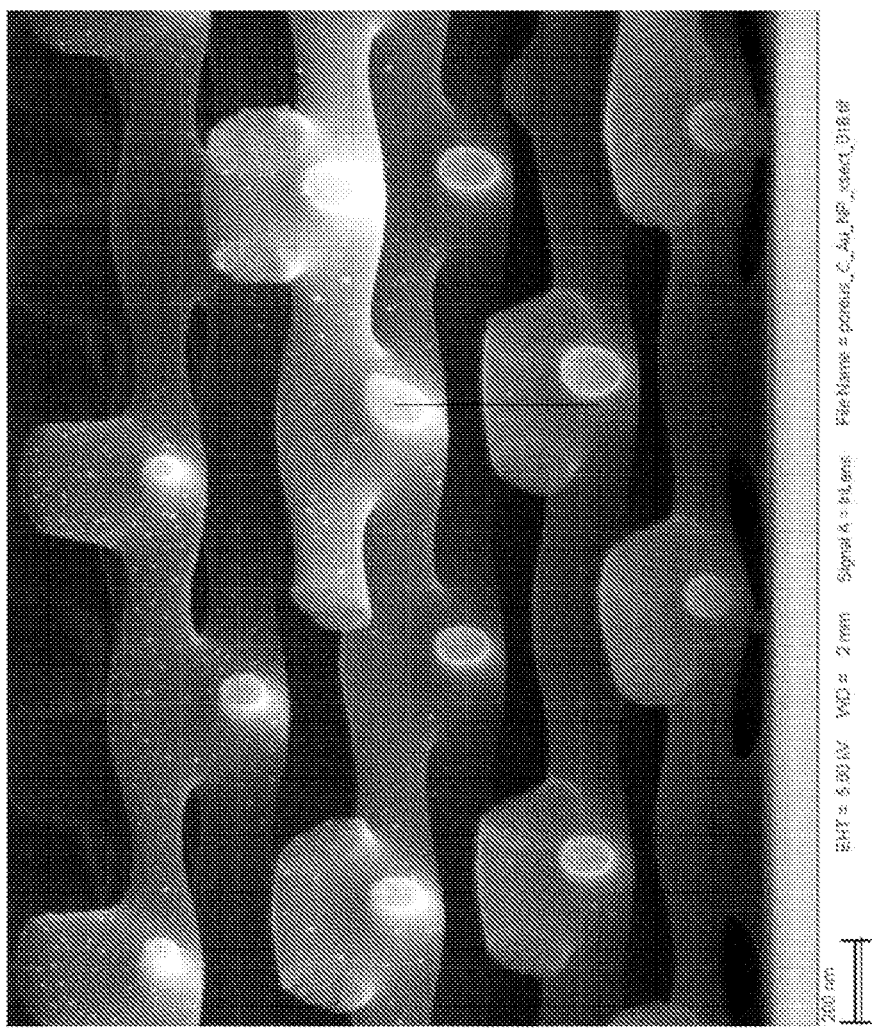
FIG. 6D is a cross-sectional view SEM image of Au-decorated electrode, showing a particle density gradient from top layer to bottom layer.

At step 5, electrochemical or other deposition can be used to decorate the porous carbon structures with metal nanoparticles. The incorporation of metal nanoparticles can be used to modify the conductivity and catalytic activity of the porous carbon structure. For example, modification of carbon surfaces with nanoparticles can be used to create highly active electrodes with electrocatalytic characteristics and have found applications as supports to immobilize a wide range of various ligands and biomolecules. See D. Hernandez-Santos et al., *Electroanal.* 12, 1461 (2000); T. M. Lee and I. M. Hsing, *Analyst* 130, 364 (2005); and A. N. Shipway et al., *ChemPhysChem* 1, 18 (2000). As an example, the pyrolyzed photoresist film electrodes described above were rinsed with isopropanol and water and dried under a stream of $N_2$. Gold nanoparticles were electrochemically deposited onto the porous pyrolyzed photoresist film structures using a $N_2$ saturated 0.1 mM $HAuCl_4$/0.5 M $H_2SO_4$ solution. The electrodes were treated with five 5 second symmetrical pulses stepping from +1.055 V to −0.05 V followed by rinsing with water and drying under a stream of $N_2$. The SEM images in FIGS. 6A and 6B show a uniform deposition of nanoparticles with particle sizes ranging from 1-3 nm. The pyrolysis of photoresist structures has been reported to result in extremely smooth near-atomically flat surfaces with minimum defects. See A. M. Nowak and R. L. McCreery, *Anal. Chem.* 76, 1089 (2004); and S. Ranganathan and R. McCreery, *Anal. Chem.* 73, 893 (2001). It is believed that the smooth surface, characteristic of pyrolyzed photoresist films, results in homogeneous nucleation sites responsible for the small and uniform particle sizes. The cross sectional image shown in FIG. 6D indicates that the AuNPs decorate only the top 2.5 layers, with the highest density of nanoparticles depositing on the top layer. The reason for the gradient of particle deposition is most likely due to poor solution penetration to the bottom layers, possibly due to hydrophobicity of the carbon and thus incomplete wetting of the underlying surfaces. Other metal nanoparticles, such as silver, platinum, and palladium, can also be deposited by electrochemical deposition. Alternatively, the metals can be deposited as films rather than as nanoparticles.

Cyclic voltammetry can be used to assess the electrochemically active surface area of the deposited Au nanoparticles. Cyclic voltammetry in $N_2$ saturated 0.05 M $H_2SO_4$ results in the formation of surface oxides on the forward scan. During the reverse scan, reduction of the formed Au surface oxide monolayer occurs. Calculating the amount of charge consumed during the reduction of the Au surface oxide monolayer at −850 mV and using a reported value of 400 $\mu C\ cm^{-2}$ indicates the real surface area for the AuNP-coated porous pyrolyzed film to be 0.033 $cm^{-2}$ (inset, FIG. 6C). See M. S. El-Deab et al., *J. Electrochem. Soc.* 150, A851 (2003).

Figure 7:
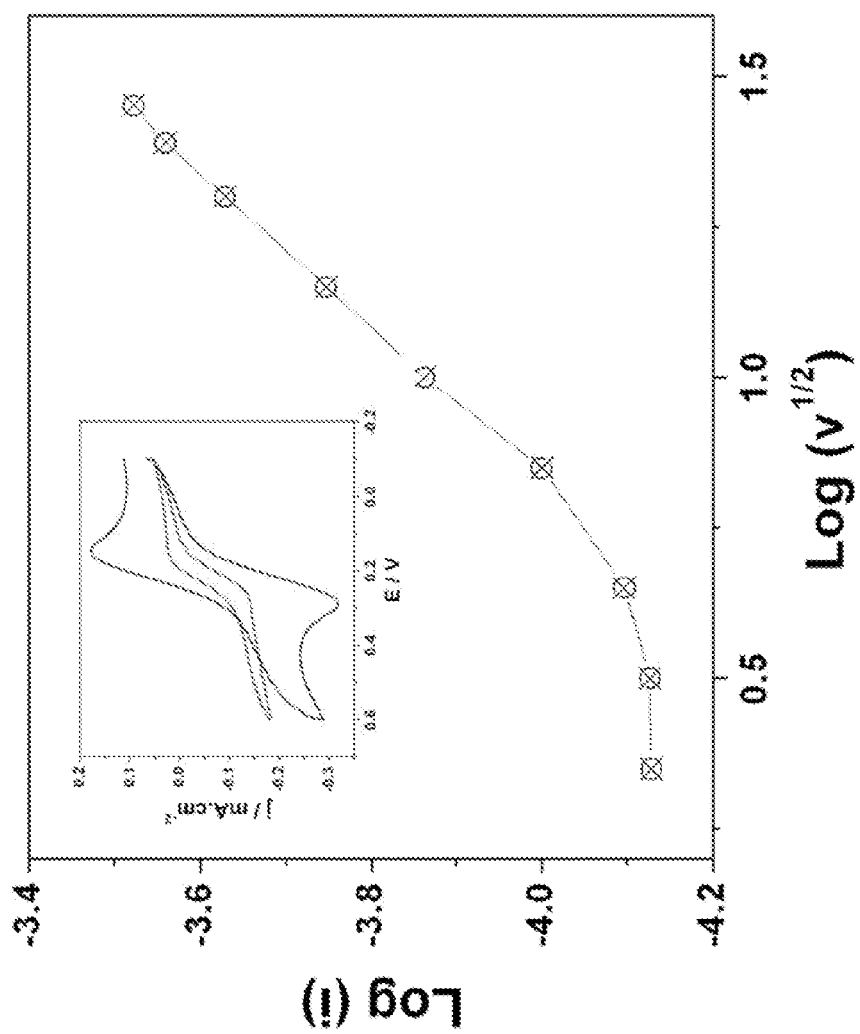
FIG. 7 is a plot of log current (i) versus log square root of scan rate ($v^{1/2}$). The inset shows cyclic voltammograms of 3-D porous carbon in 1 mM ferrocene+0.1 M tetrabutylammonium tetrafluoroborate. The scan rate was 5 and 50 mV/s.

Information about diffusional mass transport at the 3-D porous carbon structures was examined from the voltammetric response in 1 mM ferrocene, as shown in FIG. 7. A plot of anodic peak current versus the square root of the scan rate (log $i_p$ versus log $v^{1/2}$) shows a flat plateau region from 5 to 20 mV/sec followed by a linear region up to 800 mV/sec (inset). At the flat plateau the current is independent of scan rate and is indicative of hemispherical diffusion. This is also shown by the s-shaped voltammogram run at 5 mV/sec. The linear portion of the curve is characteristic of linear diffusion that typically produces peak-shaped voltammograms as shown at the scan rate of 50 mV/sec. The electrode has a profile similar to a microelectrode despite the working area being about 0.5 $cm^2$. The gradual transition from hemispherical to lateral diffusion (or s-shaped to peak shaped voltammograms) upon the increase of scan rate is typically observed in microelectrodes due to limiting conditions that are dependent on the time scale of the experiment and has been reported by several groups. See R. M. Penner and C. R. Martin, *Anal. Chem.* 59, 2625 (1987). Therefore the pore sizes in the 3-D nanostructures are apparently large enough to prevent an overlapping of the diffusion layers and preserve hemispherical diffusion at the nanometer scale arms and spokes which could be useful in acquiring high mass transport delivery of fuels for fuel cell applications.

As an example of the present invention, enhanced catalytic methanol oxidation can be achieved at the 3-D porous carbon electrodes after palladium nanoparticle modification. Metal nanoparticle-decorated carbon supports are the material of choice for fuel cell electrodes with Pt or Pd particles being the most efficient catalysts. Catalytic Pd particles were deposited onto the 3-D carbon electrodes from both aqueous and organic solvent solutions. Deposition at −0.45 V from a 2 mM Pd/0.5 M $H_2SO_4$ aqueous solution (versus Ag/AgCl reference and Pt counter electrodes) resulted in Pd deposition only on the top layers of the structures, as shown in FIGS. 8A-B. It is presumed that this inhomogeneous deposition is due to the hydrophobic carbon surface which prevents solution from penetrating into the inner pores, consistent with the previous observation of depositing gold nanoparticles onto similar structures. FIG. 8B shows that Pd particles are densely packed on the top two layers with decreased particle deposition on the third layer and no particles deposited on the connecting arms to the fourth layer. On the top two layers, most of the Pd particles are 2-D clusters, an indication of 2-D lateral growth. This is an indication of strong adhesion of Pd nuclei to the carbon surface that likely prevents particle-like 3-D growth. The particles on the third layer were sparse and unaggregated. The particle sizes and densities were largest on the top layer, and decreased from the second to third layer with the size of individual single Pd particles ranging from about 3 to 10 nm in diameter.

A more complete and uniform surface coverage of Pd particles without any additional surface treatment can be achieved with a mixed solvent of acetonitrile (MeCN) and water. MeCN can be used to increase surface wettability, while the small amount of water dissolves $PdCl_2$. A uniform deposition of Pd nanoparticles throughout the entire porous carbon structures was achieved in a MeCN:water mixture (90:10 vol %) (versus $Ag/AgNO_3$ reference and Pt counter electrodes), as shown in FIGS. 8C-D. The particle density and morphology is comparable to that shown in FIG. 8B, indicating that the surface properties of the pyrolyzed carbon, and not the solution composition, dominate in Pd nucleation and subsequent 2-D growth.

The above two as-prepared Pd electrodes shown in FIGS. 8A and C were designated as Pd/Top and Pd/Porous respectively for ease of description in subsequent discussion. FIGS. 9A and 9B show the response from cycling in $HClO_4$ and catalytic oxidation of methanol on Pd/Porous, Pd/Top, and a Pd-modified glassy carbon (Pd/GC) electrode as a control substrate. The Pd/top electrode shows the same amplitude of current as the Pd/GC electrode in both systems indicating that in this case there is not much advantage to the inhomogeneously-coated 3-D structure as it behaves much like a 2-D planar electrode due to limited solution accessibility. The Pd/Porous electrode however shows significant enhancement in catalytic current and in the charge that was transferred from methanol oxidation. The accessible Pd catalytic surface area in Pd/Porous is about 20 times that of the other two electrodes, as evaluated from the surface oxide desorption wave at ~0.4 V (cf. FIG. 9A), $0.7 \times 10^{-5}$ and $1.74 \times 10^4$ $C \cdot cm^{-2}$, respectively, while the amount of methanol being oxidized increased by a factor of 200, $2.2 \times 10^{-5}$ and $4.6 \times 10^{-3}$ $C \cdot cm^{-2}$, respectively. The greatly enhanced methanol oxidation at Pd/Porous is ten times greater than the increase of surface area from the 2-D electrodes and is attributed to increased mass transport due to hemispherical diffusion within the nanostructured surfaces.

Another advantage of hemispherical diffusion is demonstrated using the 3-D porous carbon structures as a scaffold for the electrochemical deposition of conducting polymers. It is well known that mass transport plays a crucial role in the morphology of electrochemically deposited conducting polymer films whose growth resembles that of metals. Small islands or clusters initially nucleate on the electrode surface and then grow according to a 2-D or 3-D mechanism. The initial grains (or nuclei) eventually overlap and the contiguous film growth proceeds in a 2-D manner for reaction-limited deposition conditions and 3-D for diffusion limited. See J. A. Harrison and H. R. Thirsk, *Electroanal. Chem.* 5, 67 (1971). Conducting polymers often exhibit 2-D growth on microelectrodes due to hemispherical diffusion of polymer precursors and 3-D growth as large asymmetric aggregates onto bulk electrodes. See B. J. Hwang et al., *Electrochim. Acta* 46, 2843 (2001). Fixed potential depositions of 10 mM thiophene in 0.1 M $LiClO_4$/acetonitrile performed at 0.85 V onto the 3-D porous carbon electrodes show unusually smooth and homogeneous films after 30 and 60 sec of deposition when compared to the same depositions onto planar pyrolyzed photoresist films, as shown in FIGS. 10A, B, and C respectively. The steady state mass transport of monomer molecules during deposition is believed to lead to the observed uniform 2-D film growth. Deposition of poly(pyrrole) onto the porous carbon also exhibited smooth films similar to poly(bithiophene), as shown in FIG. 10D. Other groups have observed large asymmetric particle-like structures following poly(pyrrole) deposition onto microstructured pyrolyzed photoresist films, indicating that it is the unique structures in the 3-D carbon electrodes that contribute to the homogeneous deposition, and not the material properties of the films. See K. Kinoshita et al., *J. Power Sources* 81-82, 170 (1999). High resolution SEM imaging confirms that the film deposits uniformly throughout the 3-D electrodes retaining the porous open film structure with an additional nanoporous surface morphology of the polymer deposits, as shown in FIG. 11A. A picture of the bare porous carbon is given for comparison in FIG. 11B. Therefore, two regions of hierarchical porosity are created, maximizing surface area from further nanostructuring onto the extended porous network that can still take advantage of hemispherical diffusion through the open pores. The film growth and thickness can be precisely controlled by cyclic voltammometric deposition. As shown in FIG. 12A, the increasing current after each successive cycle indicates electrochemical film growth of bithiophene films, while the SEM images of the films electrochemically grown after 0, 2, and 5 potential cycles (from 0 to +1 V) in FIGS. 12B-D show that the film thickness can be increased to control pore size. The film thickness remains relatively homogeneous at thinner films, however occasional asymmetric 3-D polymer growth increases with increasing film thickness. As the film thickness increases it will eventually reach a point where the pore size is small enough to produce overlapping diffusion layers and hence the 3-D growth starts to appear which further supports the purported mechanism that 2-D growth is favored due to hemispherical diffusion. Other conducting polymers, such aepolyaniline, can also be used. In addition, non-conducting polymers, such as polyphenol and polyaminobenzoic acid, can be deposited. Non electro-initiated polymerization techniques, such as chemical- or photo-initiated polymerizations, can also be used.

The present invention has been described as a lithographically defined microporous carbon structure. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A method for fabricating a lithographically defined microporous carbon structure, comprising:
   depositing a carbon-containing photoresist onto a substrate,
   lithographically defining a three-dimensional microporous structure in the deposited photoresist,
   developing the lithographically defined photoresist, and
   pyrolyzing the developed photoresist to provide a three-dimensional microporous carbon structure.

2. The method of claim 1, further comprising depositing metal nanoparticles onto the three-dimensional microporous carbon structure.

3. The method of claim 2, wherein the metal nanoparticles comprise gold nanoparticles.

4. The method of claim 2, further comprising depositing a catalytic metal onto the metal nanoparticles.

5. The method of claim 4, wherein the catalytic metal comprises palladium or platinum.

6. The method of claim 2, wherein the depositing metal nanoparticles comprises electrodepositing metal nanoparticles.

7. The method of claim 1, further comprising depositing a conducting polymer onto the three-dimensional microporous carbon structure.

8. The method of claim 7, wherein the conducting polymer comprises poly(pyrrole) or poly(bithiophene).

9. The method of claim 1, wherein the lithographically defining step comprises defining the three-dimensional microporous structure using interferometric lithography.

10. The method of claim 9, wherein the interferometric lithography comprises two-step interference.

11. The method of claim 1, wherein the substrate comprises silicon, fused silica, or aluminum oxide.

12. The method of claim 1, further comprising depositing a bottom anti-reflection coating on the substrate before depositing the carbon-containing photoresist.

13. The method of claim 1, wherein the carbon-containing photoresist comprises a negative resist.

14. The method of claim 1, wherein the carbon-containing photoresist comprises a positive resist.

15. The method of claim 1, wherein the carbon-containing photoresist comprises a photodefinable polymer.

16. The method of claim 15, wherein the photodefinable polymer comprises an epoxy.

17. The method of claim 15, wherein the photodefinable polymer comprises a phenolic resin or a novolac resin.

18. The method of claim 1, wherein the pyrolyzing step comprises heating the developed photoresist to a temperature greater than 900° C.

19. The method of claim 1, wherein the pore size of the three-dimensional microporous carbon structure is less than 1 micron.

20. The method of claim 1, wherein the pore size of the three-dimensional microporous carbon structure is less than 0.1 microns.

* * * * *